Jan. 17, 1967 NORIO SATO 3,299,312

TWO-CAVITY KLYSTRON OSCILLATOR USING AN AUXILIARY TUNING RESONATOR TO ADJUST THE RESONANT FREQUENCY OF THE CAVITIES

Filed Dec. 10, 1962

INVENTOR.
NORIO SATO
BY
Hopgood & Calimafde
ATTORNEYS.

United States Patent Office 3,299,312

Patented Jan. 17, 1967

3,299,312

TWO-CAVITY KLYSTRON OSCILLATOR USING AN AUXILIARY TUNING RESONATOR TO ADJUST THE RESONANT FREQUENCY OF THE CAVITIES

Norio Sato, Tokyo, Japan, assignor to Nippon Electric Company Limited, Tokyo, Japan, a corporation of Japan Filed Dec. 10, 1962, Ser. No. 243,398
Claims priority, application Japan, Dec. 12, 1961, 36/45,270
3 Claims. (Cl. 315—5.44)

Figure 1:
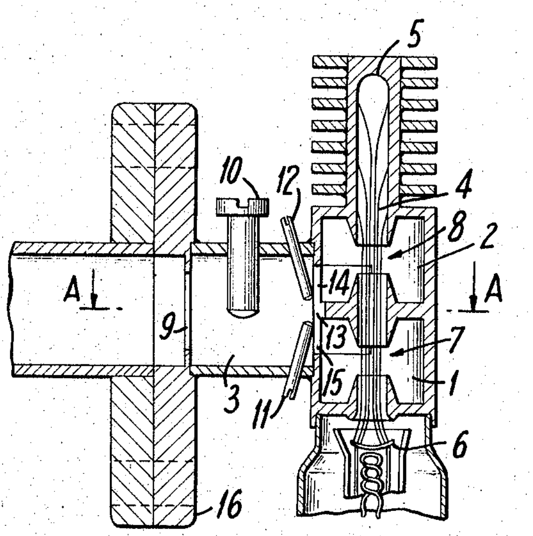

This invention relates to a high frequency electron discharge device and more particularly to a novel klystron oscillator which is provided with a cavity resonator for frequency tuning which is coupled to the internal cavity resonators which resonate at a fixed frequency, the mechanical tuning adjustment being performed by the said tuning cavity resonator.

The conventional two-cavity klystron oscillator now widely used, which is capable of mechanically tuning an oscillation frequency, is provided with two-cavity resonators coupled to an electron beam, each of the cavity resonators being provided with a portion capable of being mechanically deformed in order to perform tuning of the resonant frequency independently. In order to perform mechanical tuning adjustment of the oscillation frequencies of this klystron oscillator, it is necessary that each of the two-cavity resonators coupled to the electron beam be separately tuned to the desired frequency by mechanically deforming the resonator portions provided for that purpose. In this adjustment, if the resonant frequencies of the two-cavity resonators differ substantially, the oscillation stops naturally, making proper adjustment impossible. In order to perform this operation, it is necessary to adjust to the objective frequency gradually, while keeping balance of the resonant frequencies of the two-cavity resonators, and also maintaining the cavity impressed voltage simultaneously. The adjustment of these three independent variables by keeping their balance requires considerable previous experience, is very tedious and time consuming, and at best is difficult to achieve. Also, in order to tune the resonant frequency by mechanically deforming the internal cavity resonator which is coupled to the electron beam, it is necessary that the inside wall of the cavity resonator should have a deformable portion and also have a sliding portion in connection with it. These things, however, tend to become unstable influences in the overall characteristic of the oscillator and are likely to produce noise and other undesirable phenomena. Further, in order to provide a deformable portion in an internal cavity resonator wall which is vacuum tight, there is provided a flexible portion, such as for example a diaphragm, which is affected by heat even under comparatively small temperature excursions and is also affected by mechanical shocks and vibrations.

Recent advances in micro-wave communications require higher quality micro-wave tubes than these prior art types. Specifically these must have an extremely strong structure, must have superior high frequency characteristics, must be capable of operating quickly and easily over a fairly broad band, and must also be stable in that undesirable frequency drifting is kept to a minimum.

Accordingly, it is an object of this invention to provide a new klystron oscillator in accordance with the above requirements and in which the mechanical tuning adjustment is effected by mechanically varying the resonant frequency of a single tuning cavity resonator which is closely coupled with a plurality of cavity resonators which are coupled to the electron beam and resonate to identical or nearly identical frequencies.

Another object of the invention is to provide a novel klystron oscillator, in which the tuning cavity resonator regulates the degree of electrical coupling of the internal modulation and output cavities with the electron beam, by means of two independent mechanical adjustments, thereby varying the ratio of the voltages produced in the coupling gap of each of the modulation and the output cavity resonators which perform interaction with the electron beam, thus enabling adjustment of the oscillation of the tube.

A further object of the invention is to provide a new klystron oscillator in which the tuning cavity resonator whose resonant frequency for tuning the oscillation frequency is mechanically variable, is located apart from the electron beam and greatly stabilizes operation of the oscillator against frequency drifting due to temperature variations.

A still further object of the invention is to provide a klystron oscillator, in which the adjustment of the resonant frequency of the tuning cavity resonator does not require movement of the tube wall or envelope, thus eliminating mechanically unstable elements such as diaphragms and producing stable characteristics and strong construction.

Figure 2:
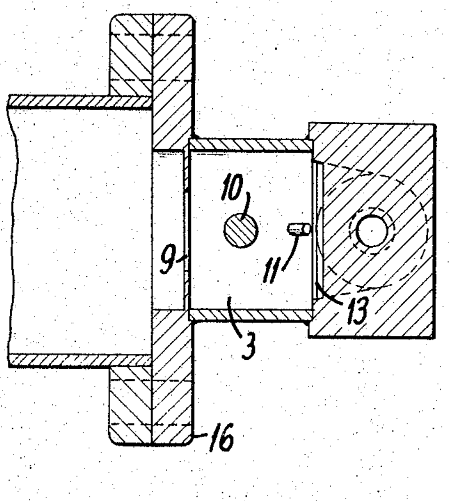

All of the objects, features and advantages of this invention and the manner of attaining them will become more apparent and the invention itself will be best understood by reference to the following description of an embodiment of the invention taken in conjunction with the accompanying drawing, in which FIG. 1 shows an axial cross section of one practical example of a novel two-cavity klystron oscillator in accordance with this invention, FIG. 2 is a cross section taken along the lines A—A of FIG. 1.

Figure 3:
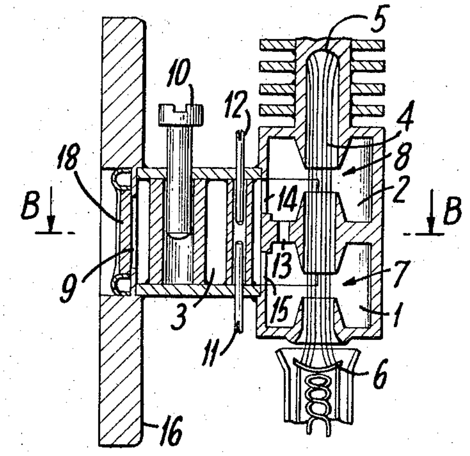
Figure 4:
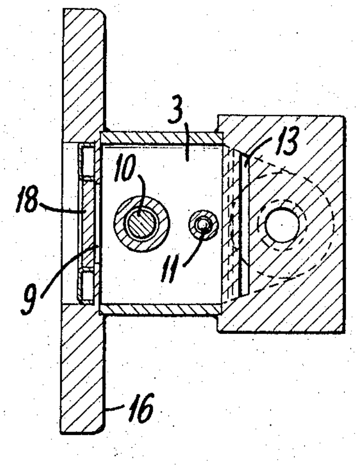

FIG. 3 shows an axial cross section of another klystron oscillator according to the present invention, and FIG. 4 shows a cross section taken along the lines B—B of FIG. 3.

In FIGS. 1 and 2, a klystron is shown in accordance with the invention in which the numeral 1 indicates an internal modulation cavity resonator and the numeral 2 indicates an internal output cavity resonator to be coupled with an electron beam 4. These cavity resonators are of the reentrant type widely employed in klystrons to provide good coupling with the electron beam, and each is designed to resonate to a fixed frequency identical or nearly identical to each other. The electron beam 4 is derived from an electron gun 6 in conjunction with a cavity accelerating voltage, and passes through the interaction gaps 7 and 8 of the internal cavity resonators 1 and 2 respectively, and enters the collector 5. Generally, a cavity resonator is operated at ground potential and the cathode is designed to be at a negative potential with respect to ground potential. An external tuning cavity resonator 3 is also provided but may also be disposed internally by suitable design. This tuning cavity resonator 3 is shown constructed from a portion of a waveguide. This cavity 3 is formed on one side by a flange plate 16 having an output coupling hole 9, the other side being common to each of the internal cavity resonators 1 and 2 through vacuum tight walls or windows 14 and 15 respectively, formed for example of mica. The resonant frequency of the resonator 3 is adjusted by a frequency tuning screw 10 located near the maximum point of the high frequency voltage.

Some of the feedback of the high frequency wave energy from the internal output cavity resonator 2 to the modulation cavity resonator 1 is conducted through the direct coupling window 13. The greater part of it however is conducted through the cavity resonator 3 by passing through the coupling window 14, which is between the output cavity resonator 2 and the external tuning cavity resonator 3, and through the coupling window 15, which is between the modulation cavity resonator 1 and the resonator 3. The degree of electrical coupling of the external tuning cavity resonator 3 to the modulation cavity resonator 1 and to the output cavity resonator 2 can be adjusted almost independently of each other by means of the two coupling degree adjusting screws 11 and 12. By this means, the ratio of the high frequency voltages produced in the modulation cavity gap 7 and in the output cavity gap 8 can be adjusted in such a way as to produce various desired oscillation characteristics in accordance with the particular application.

Regarding the conventional two cavity klystron oscillator, it is known that a floating drift klystron oscillator which accommodates a feedback circuit between the two cavity resonators has an operating mechanism similar to that of a reflex klystron. It is also well known that the ratio of high frequency voltage of the modulation gap 7 on the side of the electron gun and the high frequency voltage produced in the output gap 8 on the collector side, considerably affects the oscillation characteristics. See Proc. of the I.R.E., January 1953—A Floating Drift Tube Klystron. Thus, if the impedance of the output circuit is adjusted to an optimum value, the output efficiency will be maximum at the point where the ratio of the high frequency voltage value in the modulation gap 7 to the high frequency voltage value in the output gap 8 becomes larger than 1. The electron tuning range however becomes progressively larger as this ratio becomes smaller.

It will be appreciated therefore that if the coupling degree of the modulation cavity resonator 1 and the external tuning cavity 3 is made large by adjustment of the screw 11, and the $Q_L$ of the modulation cavity resonator 1 is made small, thus making the high frequency voltage produced in the modulation gap 7 smaller than the high frequency voltage in the output gap 8, the oscillation efficiency will be increased and the electron tuning range will become narrower. On the other hand, if (A) the coupling between the modulation cavity resonator 1 and the tuning cavity 3 is made small, making the $Q_L$ of the modulation cavity resonator 1 large and making the high frequency voltage produced in the modulation gap 7 large, and if also (B) the coupling of the output cavity resonator 2 and the tuning cavity resonator 3 is made large, making the $Q_L$ of the output cavity resonator 2 small and making the high frequency voltage produced in the output gap 8 small, then a wide electron tuning range will result. Under these conditions, however, the efficiency of the oscillator will be reduced.

In floating drift klystron oscillators of the prior art, the degree of coupling and the type and configuration of the modulation and output gaps 7 and 8, which determine the ratio of the high frequency voltages produced in these gaps, are determined during design and construction, and it is either impossible or most difficult to adjust them from outside the vacuum envelope without any consequent variation of the oscillation frequency when the oscillator is finished. According to the present invention, however, such adjustment can be effected very easily by means of the screws 10, 11 and 12.

FIGS. 3 and 4 represent other embodiments of this invention and illustrate examples wherein the cavity resonator for oscillation frequency tuning is located within the vacuum envelope. In FIGS. 3 and 4, the same numerals represent corresponding parts as in FIGS. 1 and 2. The cavity resonator 3 for the tuning of the oscillator frequency is constructed as an internal cavity resonator and a tight vacuum is achieved by means of an insulating material 18 such as ceramic, which is free from high frequency wave propagation. Further, the wavelength adjusting screw 10, and the screws 11 and 12, which adjust the degree of coupling of the tuning cavity resonator 3 to the modulation cavity resonator 1 and to the output cavity resonator 2 respectively, are designed to achieve the desired objects by moving in a vacuum tight cylinder made for example, of ceramic. The coupling windows 15 and 14 between the internal tuning cavity resonator 3 and the modulation cavity resonator 1 and the output cavity resonator 2, respectively, are completely separated, and the coupling hole 13 from the output cavity resonator 2 to the modulation cavity resonator 1 is provided separately. This coupling hole 13 may be omitted if desired. Such a structure as to provide an external tuning cavity resonator tightly coupled to an internal cavity resonator which is coupled with an electron beam and in which the tuning of an oscillation frequency is effected by means of the external tuning cavity resonator, is well known with regard to a reflex klystron. See, for example, Japanese patent application No. 23,969/1956 and also Japanese patent publication No. 9,382/1960 for an Electron Tube Device. However, these are employed only in the tuning of an oscillation frequency and the feedback of oscillation is conducted through the electron beam. According to the present invention, the tuning cavity resonator 3, whether located internally or externally, is designed to operate effectively as a feedback circuit, as well as for tuning the oscillation frequency.

Although the description above is specific only to the two cavity klystron oscillator, the invention is of course also applicable to a klystron having more than two cavities. Regarding such a multi-cavity klystron, the following two constructions are contemplated. The first construction is that in which only the modulation cavity resonator and the output cavity resonator are tightly coupled to the tuning cavity resonator, and in which a number of intermediate cavity resonators are located in the mid-region of the tube and are designed to be coupled to the electron beam but not to the tuning cavity resonator. In this case, the possible tuning frequency is limited to an extremely narrow range. In the second construction, some of the intermediate cavity resonators, the output cavity resonator and modulation cavity resonator are tightly coupled to the tuning cavity resonator, thus achieving a wider tuning frequency range.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A klystron oscillator comprising a vacuum envelope, means for generating an electron beam within said envelope, means also within said envelope for collecting the electrons from said beam, a modulation cavity resonator and an output cavity resonator disposed within said envelope, said resonators being located between said beam generating means and said electron collecting means and coupled to said electron beam, said resonators further being adapted to resonate at frequencies close to or identical to one another, a first energy transfer window in said envelope and associated with said modulation cavity resonator, a second energy transfer window in said envelope and associated with said output cavity resonator, a tuning cavity resonator electrically coupled to said modulation cavity resonator through said first window and to said output cavity resonator through said second window, said tuning cavity resonator forming a feedback circuit and including means for mechanically tuning the frequency of said oscillator, said mechanical tuning means including a first adjustable screw member located in said tuning cavity resonator in a region of maximum high frequency voltage for movement in a direction generally parallel to the path of said beam, a second adjustable screw member adjacent said first window for substantially independently varying the electrical coupling between said modulation cavity resonator and said tuning cavity resonator to thereby modify the characteristics of said oscillations, a third adjustable screw member adjacent said second window for substantially independently varying the electrical coupling between said output cavity resonator and said tuning cavity resonator to thereby modify the characteristics of said oscillations, said second and third screw members further comprising means for varying the ratio of the voltages in said modulation and output cavity resonators, and each of said screw members being movable generally into and out of the interior of said tuning cavity resonator whereby said ratio may be varied while maintaining the frequency of oscillation substantially constant.

2. The invention described in claim 1 wherein said tuning cavity resonator is disposed in contiguous relation with but external to said vacuum envelope.

3. The invention described in claim 1 wherein said tuning cavity resonator is disposed within said vacuum envelope.

References Cited by the Examiner

UNITED STATES PATENTS

| | | | |
|---|---|---|---|
| 2,816,245 | 12/1957 | Coeterier | 315—5.21 |
| 2,873,403 | 2/1959 | Geisler | 315—5.21 |
| 2,944,183 | 7/1960 | Drexler | 315—5.46 |
| 3,045,146 | 7/1962 | Haegele et al. | 315—5.21 |

HERMAN KARL SAALBACH, *Primary Examiner.*

R. D. COHN, *Assistant Examiner.*